US008151443B2

(12) United States Patent
Hobbs et al.

(10) Patent No.: US 8,151,443 B2
(45) Date of Patent: Apr. 10, 2012

(54) METHOD OF PRODUCING A WOUND MAGNET COIL

(75) Inventors: Matthew Hobbs, Oxford (GB); Edgar Charles Malcolm Rayner, North Moreton (GB)

(73) Assignee: Siemens Plc, Frimley, Camberley (GB)

( * ) Notice: Subject to any disclaimer, the term of this patent is extended or adjusted under 35 U.S.C. 154(b) by 389 days.

(21) Appl. No.: 12/174,105

(22) Filed: Jul. 16, 2008

(65) Prior Publication Data

US 2009/0031554 A1 Feb. 5, 2009

(30) Foreign Application Priority Data

Aug. 3, 2007 (GB) .................................. 0715084.0

(51) Int. Cl.
*H01F 7/06* (2006.01)

(52) U.S. Cl. ........... 29/605; 29/592.1; 29/606; 324/300; 324/309; 324/318; 324/319; 324/322; 335/216; 335/299; 335/300

(58) Field of Classification Search ................. 29/592.1, 29/599, 602.1, 605, 606; 335/216, 299, 300; 324/300, 309, 318–322
See application file for complete search history.

(56) References Cited

U.S. PATENT DOCUMENTS

| | | | |
|---|---|---|---|
| 3,117,294 A | 1/1964 | Muszynski et al. | |
| 4,808,954 A | 2/1989 | Ito | |
| 5,332,989 A | 7/1994 | Ching | |
| 2007/0247263 A1* | 10/2007 | Calvert et al. | 335/216 |

FOREIGN PATENT DOCUMENTS

| | | | |
|---|---|---|---|
| GB | 1 546 374 A | | 5/1979 |
| GB | 2 337 334 A | | 11/1999 |
| JP | 57-128012 A | | 8/1982 |
| JP | 07016946 A | * | 1/1995 |
| JP | 09148120 A | * | 6/1997 |
| JP | 09148171 A | * | 6/1997 |

OTHER PUBLICATIONS

UK Search Report dated Nov. 20, 2007 (Seven (7) pages).

* cited by examiner

*Primary Examiner* — Paul D Kim
(74) *Attorney, Agent, or Firm* — Crowell & Moring LLP

(57) ABSTRACT

A method of producing a former for winding a magnet coil, which former has a pattern of recess-defining ridges that define at least one recess into which wire may be wound to form a magnet coil. The method includes the steps of: producing an accurately machined tool bearing protrusions conforming to an inverse of said pattern of recess-defining ridges; producing said former by molding material against said accurately machined tool; and separating the former from the accurately machined tool. The invention also provides a method of producing a magnet coil employing the former so produced.

5 Claims, 1 Drawing Sheet

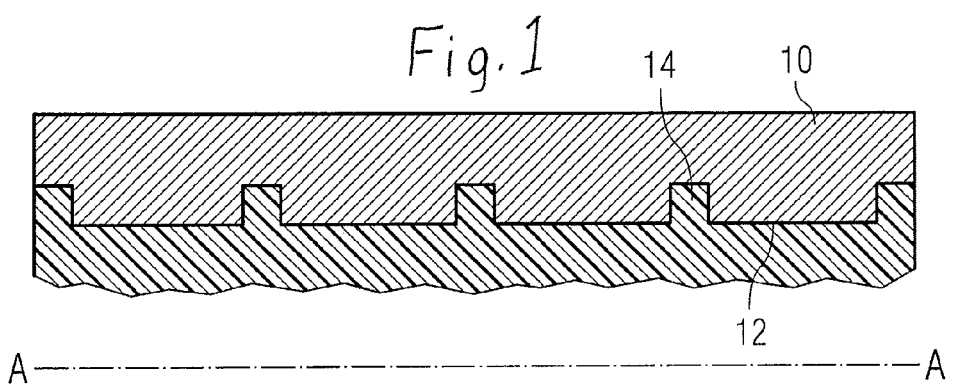
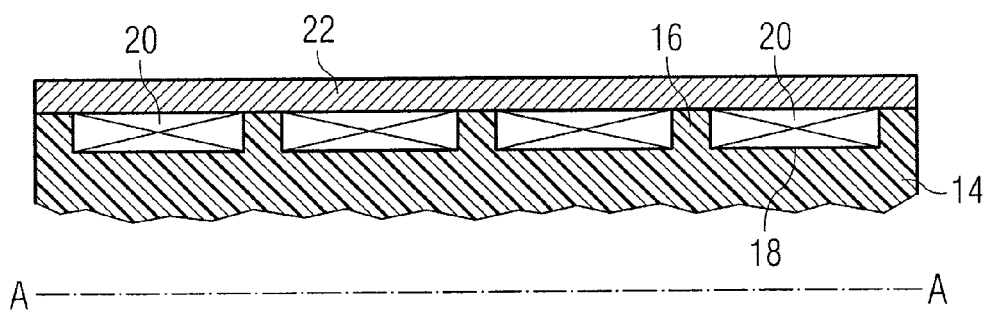

METHOD OF PRODUCING A WOUND MAGNET COIL

CROSS REFERENCE TO RELATED APPLICATIONS

This application claims priority under 35 U.S.C. §119 to Great Britain Patent Application No. 0715084.0 filed Aug. 3, 2007, the entire disclosure of which is herein expressly incorporated by reference.

BACKGROUND OF THE INVENTION

This invention relates to the production of electromagnets, and particularly substantially cylindrical superconductive magnets for use, for example, in magnetic resonance imaging (MRI) systems.

Typically, superconductive magnets for MRI systems are produced by winding superconductive wire onto a forming tool which is accurately machined with grooves to provide precise positioning for the wire. The wound coils may further be vacuum impregnated with resin to create a rigid structure.

Alternatively, a wet winding process may be used, in which a resin coated wire is used for coil winding onto the forming tool and the resulting coil structure is cured with heat.

In some cases, where the coils are subjected to strong forces during operation, it is necessary for the forming tool to remain in place to provide structural support for the coils. This is not always the case however and, in many circumstances, the resin impregnated coil structure is sufficiently self-supporting that the accurately machined forming tool can be removed for re-use.

In either event, however, difficulties arise in connection with high volume manufacture of superconductive magnets, in that each forming tool remains associated with a single coil set either permanently or at least for a significant time, extending from the set-up of the winding phase to the final setting of the resin. Thus, if magnets are to be produced at rates conducive to high volume production, many accurately machined forming tools are required. These are costly and demanding requirements.

One object of the invention is to provide a method of manufacturing a former which reduces the above described difficulties.

SUMMARY OF THE INVENTION

According to the invention there is provided a method of producing a wound magnet coil, comprising the steps of:

1) producing a former for winding the magnet coil, said former comprising a pattern of recess-defining ridges which define at least one recess, said former being produced by a method itself comprising the steps of:

(1a) producing a tool bearing a pattern of protrusions conforming to an inverse of said pattern of recess-defining ridges;

(1b) moulding material against said tool, so as to form the former; and (1c) separating the former from the tool;

2) winding wire into a recess of the former to form a resin-impregnated magnet coil;

3) allowing the resin to cure; and 4) disposing of the former after the resin has cured.

The present invention also provides a method of producing a wound magnet comprising a plurality of wound coils, wherein the former comprises a corresponding plurality of recesses, into which the plurality of resin-impregnated magnet coils are wound; and wherein the resin is allowed to cure before the former is disposed of.

Step (2) may comprise the step of vacuum impregnating wound coil(s) with a curable resin. Alternatively, step (2) may comprise using a resin coated wire for coil winding, and step (3) may comprise curing the resulting coil structure with heat.

In use, the wire may be rendered superconducting by cooling to an appropriate temperature.

The coil may be provided with an oversleeve of composite material.

By means of the invention, many formers can be produced from a single accurately machined tool, thus facilitating and rendering more economical the volume manufacture of superconductive magnets.

Other objects, advantages and novel features of the present invention will become apparent from the following detailed description of one or more preferred embodiments when considered in conjunction with the accompanying drawings.

BRIEF DESCRIPTION OF THE DRAWING

FIG. 1 illustrates the production of a former from an accurately machined tool; and FIG. 2 shows a coil assembly formed on the former of FIG. 1.

DETAILED DESCRIPTION OF THE DRAWINGS

FIG. 1 illustrates the manufacture of a former 14; and FIG. 2 illustrates a coil assembly 20, 22 formed on the former 14, according to steps in a method of the present invention. In each figure, the drawing represents a half-cross-section along the axis of cylindrical former 14. All parts are rotationally symmetrical about the axis A-A, although the axially inner surface of the former 14 may be allowed to be irregular, as shown.

Referring now FIG. 1, a tool 10 is machined with high accuracy to present protrusions, such that the tool presents a surface 12 the inverse of a desired surface of coil-defining structure. As is well known in the art of moulding and casting, a suitable medium, in this case a ceramic material, is moulded against the inverse surface 12 to create a former 14 presenting a desired coil-defining structure comprising ridges 16 defining recesses, or grooves, 18 into which the wire is wound to create the desired magnet coils, as shown, for example, at 20. Preferably, superconductive wire is used, such that the resultant coils may be rendered superconducting in use by cooling to an appropriate temperature.

In some embodiments, the coils such as 20, so wound, are vacuum impregnated with a curable resin material. The former 14 can then be broken away and disposed of, leaving either independent free-standing coils or coils linked together by the windings. The coils 20 may be provided with an oversleeve 22 of composite material such as glass reinforced plastic.

Once the resin impregnation has hardened, the former 14 may be broken away and disposed of.

According to an aspect of the present invention, a single accurately machined tool 10 may be employed to produce many formers 14. This represents a much reduced capital investment as compared to providing a large number of formers which are each accurately machined. Accurately machined formers are not left in position supporting coils when they are sent to a user, reducing the cost of the supplied coil arrangement.

While the invention has been described with particular reference to vacuum impregnation of coils to create the stable coil structures, the present invention may also be applied to wet winding processes, in which a resin coated wire is used for coil winding, and the resulting coil structure is cured with heat.

The present invention has also been described with particular reference to cylindrical electromagnets, particularly cylindrical superconducting electromagnets, as are common in present MRI systems. However, the present invention may be applied to the production of non-superconducting magnets, and non-cylindrical magnets, for example employing asymmetric formers. Such formers may be even more difficult to accurately produce than cylindrical formers, so the potential benefits of providing only a single accurately-machined tool, according to the invention, rather than many accurately-machined formers, as in the prior art, may be particularly significant.

In any event, it will be appreciated that the expedient of using a single, accurately machined tool 10 to create many magnet formers facilitates the economic volume production of superconductive magnets.

The invention claimed is:

1. A method comprising the steps of:
    1) producing a former for winding a magnet coil, said former having a desired coil-defining structure comprising a plurality of recess-defining ridges which define a plurality of recesses, wherein said former is produced by:
        (1a) moulding material against a tool bearing a pattern of protrusions conforming to an inverse of said plurality of recess-defining ridges, so as to create the former; and
        (1b) separating the former from the tool;
    2) winding wire into the plurality of recesses of the former to form a corresponding at least one magnet coil;
    3) impregnating said at least one magnet coil with a resin;
    4) allowing the resin to cure; and
    5) forming a wound magnet coil by disposing of the entire former after the resin has cured.

2. The method according to claim 1, wherein step (3) comprises vacuum impregnating said at least one magnet coil with the curable resin.

3. The method according to claim 1, wherein:
    step (3) comprises using a resin coated wire for coil winding; and
    step (4) comprises curing the resin with heat.

4. The method according to claim 1, wherein, the step of winding is performed using a superconductive wire.

5. The method according to claim 1, wherein the magnet coil is provided with an oversleeve of composite material.

* * * * *